United States Patent [19]
Ping et al.

[11] Patent Number: 5,869,389
[45] Date of Patent: Feb. 9, 1999

[54] SEMICONDUCTOR PROCESSING METHOD OF PROVIDING A DOPED POLYSILICON LAYER

[75] Inventors: Er-Xang Ping; Randhir P. S. Thakur, both of Boise, Id.

[73] Assignee: Micron Technology, Inc., Boise, Id.

[21] Appl. No.: 588,573

[22] Filed: Jan. 18, 1996

[51] Int. Cl.$^6$ .................................................. H01L 21/20
[52] U.S. Cl. ..................... 438/486; 438/482; 438/488; 438/491; 438/660; 438/684
[58] Field of Search .................................. 438/482, 486, 438/488, 491, 660, 684

[56] References Cited

U.S. PATENT DOCUMENTS

| | | | |
|---|---|---|---|
| 5,147,826 | 9/1992 | Liu et al. | 437/233 |
| 5,155,051 | 10/1992 | Noguchi et al. | 437/4 |
| 5,242,855 | 9/1993 | Oguro | 437/109 |
| 5,464,795 | 11/1995 | Oguro | 437/233 |

*Primary Examiner*—Peter Toby Brown
*Assistant Examiner*—Long Pham
*Attorney, Agent, or Firm*—Wells, St. John, Roberts, Gregory & Matkin P.S.

[57] ABSTRACT

A semiconductor processing method of providing a doped polysilicon layer atop a substrate includes, a) depositing a layer of substantially amorphous silicon having a dopant concentration of less than or equal to about $1\times10^{16}$ atoms/$cm^3$ over a substrate to a thickness of less than or equal to about 30 Angstroms; b) depositing a layer of silicon over the amorphous silicon layer in a manner which in situ dopes such layer to a dopant concentration of greater than about $1\times10^{16}$ atoms/$cm^3$; and c) providing the deposited silicon layers to be polycrystalline. Preferably, the substantially amorphous layer is entirely undoped as-deposited. The invention is believed to have greatest applicability to provision of thin film doped polysilicon layers having thicknesses of less than or equal to about 100 Angstroms. Accordingly, the combined thickness of the deposited silicon layers is preferably less than or equal to about 100 Angstroms. The preferred method for providing the deposited silicon layers to be polycrystalline is by rapid thermal processing. Such, or other processing, also effectively dopes the first deposited silicon layer by out-diffusion from the second deposited layer.

32 Claims, 1 Drawing Sheet

SEMICONDUCTOR PROCESSING METHOD OF PROVIDING A DOPED POLYSILICON LAYER

TECHNICAL FIELD

This invention relates to the formation of in sit doped polysilicon films in semiconductor wafer processing, and principally to provision of such films having a thicknesses of less than or equal to about 100 Angstroms.

BACKGROUND OF THE INVENTION

The reduction in memory cell size required for high density dynamic random access memories (DRAMs) results in a corresponding decrease in the area available for the storage node of the memory cell capacitor. Yet, design and operational parameters determine the minimum charge required for reliable operation of the memory cell despite decreasing cell area. Several techniques have been developed to increase the total charge capacity of the cell capacitor without significantly affecting the chip area. These include structures utilizing trench and stacked capacitors, as well as the utilization of new capacitor dielectric materials having higher dielectric constants.

One common material utilized for capacitor plates is conductively doped polysilicon. Such is utilized because of its compatibility with subsequent high temperature processing, good thermal expansion properties with $SiO_2$, and its ability to be conformally deposited over widely varying topography.

As background, silicon occurs in crystalline and amorphous forms. Further, there are two basic types of crystalline silicon known as monocrystalline silicon and polycrystalline silicon. Polycrystalline silicon, polysilicon for short, is typically in situ or subsequently conductively doped to render the material conductive. Monocrystalline silicon is typically epitaxially grown from a silicon substrate. Silicon films deposited on dielectrics (such as $SiO_2$ and $Si_3N_4$) result in either an amorphous or polycrystalline phase. Specifically, it is generally known within the prior art that silicon deposited at wafer temperatures of less than approximately 580° C. will result in an amorphous silicon layer, whereas silicon deposited at temperatures higher than about 580° C. will result in a polycrystalline layer. The specific transition temperature depends on the source chemicals/precursors and the reactor used for the deposition.

The continued increase in circuit density continues to drive the thickness of the capacitor and gate layers in DRAM cells to smaller dimensions. Yet, the application of doped polysilicon films in DRAM memory cells demands high quality thin films. Historically, very thin polysilicon films (i.e., less than or equal to about 100 Angstroms) are fundamentally difficult to achieve, and the necessity of conductively doping such thin films is even more problematic. Generally, there are two basic approaches to doping thin film polysilicon, namely a) ion implantation, and b) in-situ doping during silicon film deposition. It has usually been easier to control the doping concentration through ion implantation than by in situ doping. However, ion implantation of dopants is typically limited to lower dopant concentrations, such as less than or equal to about $1\times10^{16}$ atoms/$cm^3$. In many applications, desired dopant concentrations to render polysilicon films suitably conductive exceeds $10^{20}$ atoms/$cm^3$. Therefore, in situ doping (which is capable of much higher level doping without damage as compared to ion implantation) continues to be a desired form of processing for thin polysilicon films.

In-situ doping is commonly achieved by feeding a dopant gas to a chemical vapor deposition reactor simultaneously with feeding of a suitable silicon source gas. Example silicon source gases include silane ($SiH_4$), disilane ($Si_2H_6$), trisilane, and organosilane, while example conductivity enhancing dopant gases include phosphine ($PH_3$), diborane ($B_2H_6$), arsine ($AsH_3$) and certain organometallic precursors. However, the resultant silicon film from the high level doping can suffer serious drawbacks. Such include the degradation of the interface of such film to the substrate, which in the presence of the dopant atoms can initiate local undesired strains in the resultant silicon film. Such local strains can further propagate to induce gathering of dopant atoms which can be particularly problematic the thinner the desired resultant polysilicon film. The situation is magnified where a polysilicon film is being provided over a $SiO_2$ layer, which is typically the case. The result of the above mentioned situations can be a non-uniformity of the film thickness and in the sheet resistance from position to position and in wafer to wafer.

Accordingly, needs remain for producing improved polysilicon layers which are effectively in situ conductively doped during provision of the silicon on the substrate. Although the invention principally arose out of concerns specific to the art area of provision of thin doped polysilicon films, the artisan will appreciate applicability of the invention to thicker polysilicon films as well. The invention is limited only by the accompanying claims appropriately interpreted in accordance with the Doctrine Of Equivalents.

BRIEF DESCRIPTION OF THE DRAWINGS

Preferred embodiments of the invention are described below with reference to following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In a accordance with one aspect of the invention, a semiconductor processing method of providing a doped polysilicon layer atop a substrate comprises the following steps:

depositing a layer of substantially amorphous silicon having a dopant concentration of less than or equal to about $1\times10^{16}$ atoms/$cm^3$ over a substrate to a thickness of less than or equal to about 30 Angstroms; and depositing a layer of silicon over the amorphous silicon layer in a manner which in situ dopes such layer to a dopant concentration of greater than about $1\times10^{16}$ atoms/$cm^3$; and providing the deposited silicon layers to be polycrystalline.

In accordance with another aspect of the invention, a semiconductor processing method of providing a thin film doped polysilicon layer atop a substrate comprising the following steps:

depositing a layer of substantially amorphous silicon having a dopant concentration of less than or equal to about $1\times10^{16}$ atoms/cm$^3$ over a substrate to a thickness of less than or equal to about 30 Angstroms;

depositing a layer of silicon over the amorphous silicon layer in a manner which in situ dopes such layer to a dopant concentration of greater than about $1\times10^{16}$ atoms/cm$^3$, the layer of silicon deposited over the amorphous silicon layer being deposited to a thickness which provides a total combined thickness of the deposited silicon layers which is less than or equal to about 100 Angstroms; and providing the deposited silicon layers to be polycrystalline.

In accordance with another aspect of the invention, a semiconductor processing method of providing a doped polysilicon layer atop a substrate comprises the following steps:

depositing a layer of substantially undoped amorphous silicon over a substrate to a thickness of less than or equal to about 30 Angstroms; and depositing a layer of silicon over the amorphous silicon layer in a manner which in situ dopes such layer with a conductivity enhancing impurity; and providing the deposited silicon layers to be polycrystalline.

Figure 1:
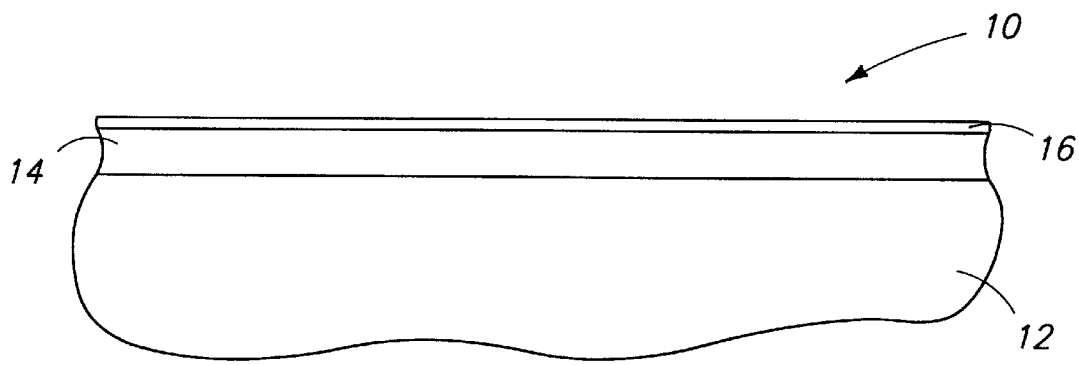
FIG. 1 is a diagrammatic cross sectional view of a wafer fragment at one processing step in accordance with the invention.

Referring first to FIG. 1, a semiconductor wafer fragment in process is indicated generally with reference numeral 10. Such comprises a bulk monocrystalline silicon substrate 12 having a layer of SiO$_2$ 14 deposited thereover. A layer 16 of substantially amorphous silicon is deposited over substrate 14/12 to a thickness of less than or equal to about 30 Angstroms. Most preferably, the thickness of layer 16 is from about 10 Angstroms to about 30 Angstroms. Layer 16 as-deposited most preferably constitutes essentially undoped silicon. Alternately but less preferred, some small concentration of a conductivity enhancing impurity can be provided with an upper limit of $1\times10^{16}$ atoms/cm$^3$ believed to be the upper concentration limit which will still enable objectives of the invention described below to be achieved. Preferred pressure for layer 16 deposition is at least 10$^{-6}$ Torr, with a reactor temperature of less than or equal to 555° C.

Figure 2:
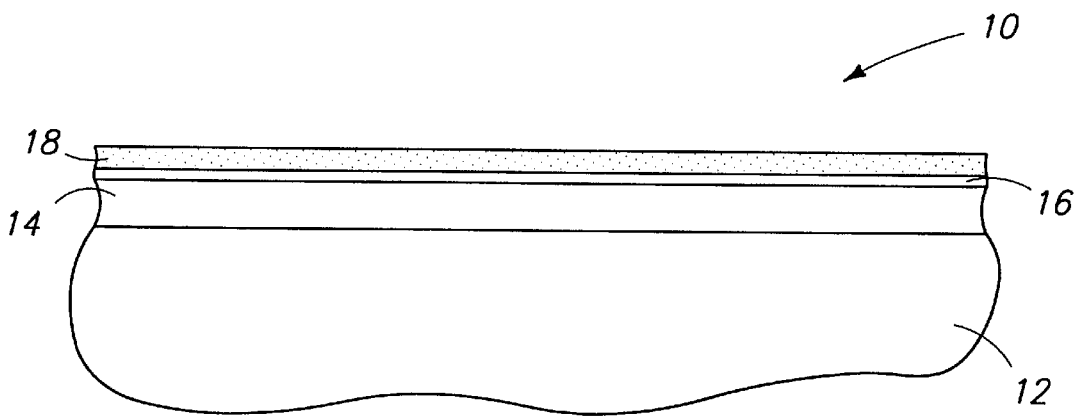
FIG. 2 is a view of the FIG. 1 wafer fragment at a processing step subsequent to that shown by FIG. 1.

Referring to FIG. 2, a layer 18 of silicon is deposited over amorphous silicon layer 16 in a manner which in situ dopes such layer to a dopant concentration of greater than about $1\times10^{16}$ atoms/cm$^3$. A preferred dopant concentration is greater than $1\times10^{20}$ atoms/cm$^3$. Where most preferably the composite of silicon layers 16 and 18 is to comprise a thin film doped polysilicon layer, the thickness of layer 18 is chosen to provide the combined thickness of layers 16 and 18 to be less than or equal to about 100 Angstroms.

Preferably, layer 18 is deposited in a manner which provides such layer to itself be substantially amorphous as-deposited. Such is preferably accomplished by a continuous, in-situ process in the same reaction chamber utilizing the same silicon source gases and increasing a flow rate of a suitable desired dopant impurity gas. For example, a wafer is positioned inside a chemical vapor deposition reactor with the reactor then being sealed and evacuated to a suitable inert and preferably low pressure atmosphere. An example and preferred low pressure range for the processing is from about 50 mTorr to about 250 mTorr. The wafer temperature within the reactor is further provided to a suitable temperature, typically and preferably from about 500° C. to about 555° C. A silicon source gas is then fed to the chemical vapor deposition reactor, with examples being SiH$_4$, Si$_2$H$_6$, Si$_3$H$_8$ or organosilane. The initial feeding of such silicon source gas can be with some suitably low first rate of dopant gas flow (preferably a flow rate of 0 sccm) such that the resultant layer 16 has a dopant concentration of no greater than about $1\times10^{16}$ atoms/cm$^3$. Phosphine, arsine and diborane are two example gases.

Such silicon source gas flow is continued, and preferably at the same rate, with some suitable subsequent increase in dopant gas flow rate to a higher second rate effective to provide a desired dopant concentration in the formed layer 18, which will typically be greater than about $1\times10^{16}$ atoms/cm$^3$. Preferably, the temperature and pressure are maintained constant throughout the above described first and second depositions such that only dopant gas flow rate is varied. Thus, both layers 16 and 18 as initially deposited will be substantially amorphous. Alternately but less preferred, layer 18 as deposited could be in situ formed to be polycrystalline.

Figure 3:
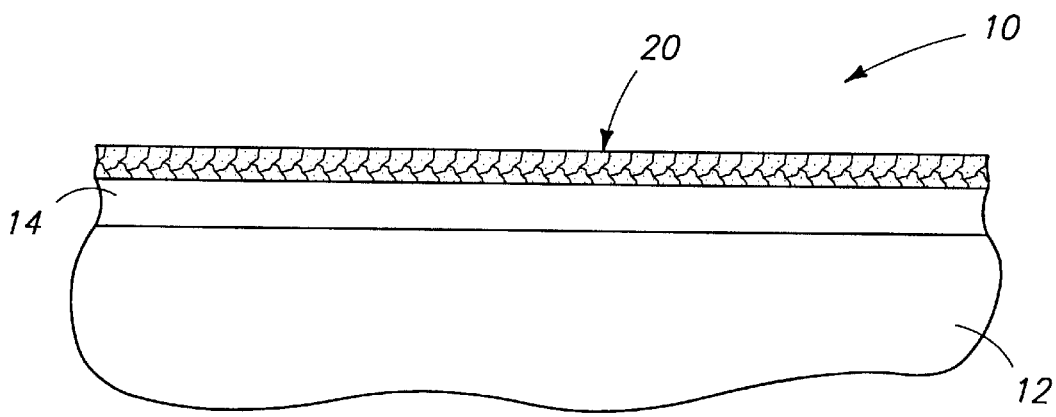
FIG. 3 is a view of the FIG. 1 wafer fragment at a processing step subsequent to that shown by FIG. 2.

Regardless and referring to FIG. 3, deposited silicon layers 16 and 18 are ultimately provided to be polycrystalline to produce a composite, homogeneous layer 20. Preferably after forming layers 16 and 18, a higher temperature anneal step is conducted to achieve polycrystalline transformation. Such can occur in the same chamber as the deposition of layer 18, or in a different chamber. An example anneal temperature includes at least 600° C. at atmospheric or lower pressure. Annealing time is typically at least 10 seconds for rapid thermal processing, and at least one minute for fast furnace processing or standard furnace annealing. The annealing atmosphere is preferably inert, including one or more inert gases. Such annealing will also advantageously have the effect of causing or imparting diffusion of the desired dopant atoms from layer 18 into layer 16 to effectively render the resultant layer 20 substantially continuous with dopant atoms at a desired concentration.

The following is a set of but one example processing conditions for achieving the illustrated FIG. 3 construction for a 100 Angstrom film. Greater thickness are also possible, such as from 500 Angstroms to 4000 Angstroms.:

wafer temperature during deposition at a constant 500° C.;

reactor pressure during deposition being maintained at a constant 119 mTorr;

SiH$_4$ flow rate during both silicon layer depositions being a constant 200 sccm;

a 20 sccm PH$_3$ flow commenced 2 minutes after pure SiH$_4$ flow, and continued for 6 minutes to provide a 100 Angstrom composite thickness of layers 16 and 18;

subsequent rapid thermal processing conditions to 900° C. to provide a resultant polycrystalline silicon layer 20 film of a dopant concentration of about $5\times10^{20}$ atoms/cm$^3$.

Initial provision of such an example thin silicon film 16 in the above manner serves as a buffer to improve the interface between subsequent heavily in situ doped layer 18 and underlying substrate 14/12. Such releases strain which would otherwise occur, and prevents gathering of dopant atoms during crystallization of layer 18 and resultant layer 20, regardless of whether layer 18 is provided initially to be polycrystalline or initially to be amorphous. Ultimate dopant diffusion from layer 18 into layer 16 as layer 20 results can be accomplished by a dedicated high temperature step, or more preferably would typically inherently occur during subsequent high temperature wafer processing steps, such as Si$_3$N$_4$ and SiO$_2$ depositions. The uniformity of the resultant film is improved, along with doping efficiency, as more of the dopant atoms are able to substitute for silicon in the lattice instead of being trapped by grains which grow significantly near regions where strong strain exists. Provision of a suitably thin amorphous silicon layer as a buffer layer described above significantly improves the quality and controllability of the resulting layer 20. Any of the respective illustrated layers could, of course, be patterned and etched before, during or after the inventive processing.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A semiconductor processing method of providing a doped polysilicon layer atop a substrate comprising the following steps:

depositing a layer of substantially amorphous silicon having a dopant concentration of less than or equal to about $1 \times 10^{16}$ atoms/cm$^3$ over a substrate to a thickness of less than or equal to about 30 Angstroms; and depositing a layer of silicon over the amorphous silicon layer in situ doped to a dopant concentration of greater than about $1 \times 10^{16}$ atoms/cm$^3$; and converting said substantially amorphous silicon layer to polycrystalline silicon.

2. The semiconductor processing method of providing a doped polysilicon layer of claim 1 wherein the layer of silicon deposited over the amorphous silicon layer is itself substantially amorphous as-deposited, and further comprising converting said layer of silicon deposited over the amorphous layer to polycrystalline silicon.

3. The semiconductor processing method of providing a doped polysilicon layer of claim 1 wherein the converting step comprises rapid thermal processing.

4. The semiconductor processing method of providing a doped polysilicon layer of claim 1 wherein, the layer of silicon deposited over the amorphous silicon layer is itself substantially amorphous as-deposited;

the converting step comprising rapid thermal processing of both substantially amorphous layers.

5. The semiconductor processing method of providing a doped polysilicon layer of claim 1 wherein the substantially amorphous silicon layer is provided to a thickness of from about 10 Angstroms to about 30 Angstroms.

6. The semiconductor processing method of providing a doped polysilicon layer of claim 1 wherein the depositing steps utilize the same silicon source gas during deposition, the two depositing steps collectively comprising initially feeding the silicon source gas with a first rate of dopant gas flow followed by continued silicon source gas feeding with a subsequent increase in dopant gas flow to a higher second rate.

7. The semiconductor processing method of providing a doped polysilicon layer of claim 1 wherein the depositing steps utilize the same silicon source gas during deposition, the two depositing steps collectively comprising initially feeding the silicon source gas with a first rate of dopant gas flow followed by continued silicon source gas feeding with a subsequent increase in dopant gas flow to a higher second rate, the two depositing steps being conducted at a temperature range from about 500° C. to about 555° C. to render both the silicon layers to be amorphous as-deposited.

8. The semiconductor processing method of providing a doped polysilicon layer of claim 1 wherein, the depositing steps utilize the same silicon source gas during deposition, the two depositing steps collectively comprising initially feeding the silicon source gas with a first rate of dopant gas flow followed by continued silicon source gas feeding with a subsequent increase in dopant gas flow to a higher second rate, the two depositing steps being conducted at a temperature range from about 500° C. to about 555° C. to render both the silicon layers to be amorphous as-deposited; and the converting step comprising rapid thermal processing of both substantially amorphous layers.

9. A semiconductor processing method of providing a doped polysilicon layer atop a substrate comprising the following steps:

depositing a layer of substantially undoped amorphous silicon over a substrate to a thickness of less than or equal to about 30 Angstroms; and depositing a layer of silicon over the amorphous silicon layer in situ doped with a conductivity enhancing impurity; and converting said substantially amorphous silicon layer to polycrystalline silicon.

10. The semiconductor processing method of providing a doped polysilicon layer of claim 9 wherein the layer of silicon deposited over the amorphous silicon layer is itself substantially amorphous as-deposited, and further comprising converting said layer of silicon deposited over the amorphous layer to polycrystalline silicon.

11. The semiconductor processing method of providing a doped polysilicon layer of claim 9 wherein the converting step comprises rapid thermal processing.

12. The semiconductor processing method of providing a doped polysilicon layer of claim 9 wherein, the layer of silicon deposited over the amorphous silicon layer is itself substantially amorphous as-deposited;

the converting step comprising rapid thermal processing of both substantially amorphous layers.

13. The semiconductor processing method of providing a doped polysilicon layer of claim 9 wherein the substantially amorphous silicon layer is provided to a thickness of from about 10 Angstroms to about 30 Angstroms.

14. The semiconductor processing method of providing a doped polysilicon layer of claim 9 wherein the depositing steps utilize the same silicon source gas during deposition, the two depositing steps collectively comprising initially feeding the silicon source gas with no dopant gas flow followed by continued silicon source gas feeding with a dopant gas flow.

15. The semiconductor processing method of providing a doped polysilicon layer of claim 9 wherein the depositing steps utilize the same silicon source gas during deposition, the two depositing steps collectively comprising initially feeding the silicon source gas with no dopant gas flow followed by continued silicon source gas feeding with a dopant gas flow, the two depositing steps being conducted at a temperature range from about 500° C. to about 555° C. to render both the silicon layers to be amorphous as-deposited.

16. The semiconductor processing method of providing a doped polysilicon layer of claim 9 wherein, the depositing steps utilize the same silicon source gas during deposition, the two depositing steps collectively comprising initially feeding the silicon source gas with a first rate of dopant gas flow followed by continued silicon source gas feeding with a subsequent increase in dopant gas flow to a higher second rate, the two depositing steps being conducted at a temperature range from about 500° C. to about 555° C. to render both the silicon layers to be amorphous as-deposited; and the converting step comprising rapid thermal processing of both substantially amorphous layers.

17. A semiconductor processing method of providing a thin film doped polysilicon layer atop a substrate comprising the following steps:

depositing a layer of substantially amorphous silicon having a dopant concentration of less than or equal to about $1 \times 10^{16}$ atoms/cm$^3$ over a substrate to a thickness of less than or equal to about 30 Angstroms;

depositing a layer of silicon over the amorphous silicon layer in situ doped to a dopant concentration of greater than about $1 \times 10^{16}$ atoms/cm$^3$, the layer of silicon deposited over the amorphous silicon layer being deposited to a thickness which provides a total combined thickness of the deposited silicon layers which is less than or equal to about 100 Angstroms; and converting said substantially amorphous silicon layer to polycrystalline silicon.

18. The semiconductor processing method of providing a doped polysilicon layer of claim 17 wherein the layer of silicon deposited over the amorphous silicon layer is itself substantially amorphous as-deposited, and further comprising converting said layer of silicon deposited over the amorphous layer to polycrystalline silicon.

19. The semiconductor processing method of providing a doped polysilicon layer of claim 17 wherein the converting step comprises rapid thermal processing.

20. The semiconductor processing method of providing a doped polysilicon layer of claim 17 wherein, the layer of silicon deposited over the amorphous silicon layer is itself substantially amorphous as-deposited;

the converting step comprising rapid thermal processing of both substantially amorphous layers.

21. The semiconductor processing method of providing a thin film doped polysilicon layer of claim 17 wherein the substantially amorphous silicon layer is provided to a thickness of from about 10 Angstroms to about 30 Angstroms.

22. The semiconductor processing method of providing a thin film doped polysilicon layer of claim 17 wherein the depositing steps utilize the same silicon source gas during deposition, the two depositing steps collectively comprising initially feeding the silicon source gas with a first rate of dopant gas flow followed by continued silicon source gas feeding with a subsequent increase in dopant gas flow to a higher second rate.

23. The semiconductor processing method of providing a thin film doped polysilicon layer of claim 17 wherein the depositing steps utilize the same silicon source gas during deposition, the two depositing steps collectively comprising initially feeding the silicon source gas with a first rate of dopant gas flow followed by continued silicon source gas feeding with a subsequent increase in dopant gas flow to a higher second rate, the two depositing steps being conducted at a temperature range from about 500° C. to about 555° C. to render both the silicon layers to be amorphous as-deposited.

24. The semiconductor processing method of providing a thin film doped polysilicon layer of claim 17 wherein, the depositing steps utilize the same silicon source gas during deposition, the two depositing steps collectively comprising initially feeding the silicon source gas with a first rate of dopant gas flow followed by continued silicon source gas feeding with a subsequent increase in dopant gas flow to a higher second rate, the two depositing steps being conducted at a temperature range from about 500° C. to about 555° C. to render both the silicon layers to be amorphous as-deposited; and the converting step comprising rapid thermal processing of both substantially amorphous layers.

25. A semiconductor processing method of providing a thin film doped polysilicon layer atop a substrate comprising the following steps:

depositing a layer of substantially undoped amorphous silicon over a substrate to a thickness of less than or equal to about 30 Angstroms;

depositing a layer of silicon over the amorphous silicon layer in situ doped with a conductivity enhancing impurity, the layer of silicon deposited over the amorphous silicon layer being deposited to a thickness which provides a total combined thickness of the deposited silicon layers which is less than or equal to about 100 Angstroms; and converting said substantially amorphous silicon layer to polycrystalline silicon.

26. The semiconductor processing method of providing a doped polysilicon layer of claim 25 wherein the layer of silicon deposited over the amorphous silicon layer is itself substantially amorphous as-deposited, and further comprising converting said layer of silicon deposited over the amorphous layer to polycrystalline silicon.

27. The semiconductor processing method of providing a doped polysilicon layer of claim 25 wherein the converting step comprises rapid thermal processing.

28. The semiconductor processing method of providing a doped polysilicon layer of claim 25 wherein, the layer of silicon deposited over the amorphous silicon layer is itself substantially amorphous as-deposited;

the converting step comprising rapid thermal processing of both substantially amorphous layers.

29. The semiconductor processing method of providing a thin film doped polysilicon layer of claim 25 wherein the substantially amorphous silicon layer is provided to a thickness of from about 10 Angstroms to about 30 Angstroms.

30. The semiconductor processing method of providing a thin film doped polysilicon layer of claim 25 wherein the depositing steps utilize the same silicon source gas during deposition, the two depositing steps collectively comprising initially feeding the silicon source gas with no dopant gas flow followed by continued silicon source gas feeding with a dopant gas flow.

31. The semiconductor processing method of providing a thin film doped polysilicon layer of claim 25 wherein the depositing steps utilize the same silicon source gas during deposition, the two depositing steps collectively comprising initially feeding the silicon source gas with no dopant gas flow followed by continued silicon source gas feeding with a dopant gas flow, the two depositing steps being conducted at a temperature range from about 500° C. to about 555° C. to render both the silicon layers to be amorphous as-deposited.

32. The semiconductor processing method of providing a thin film doped polysilicon layer of claim 25 wherein, the depositing steps utilize the same silicon source gas during deposition, the two depositing steps collectively comprising initially feeding the silicon source gas with a first rate of dopant gas flow followed by continued silicon source gas feeding with a subsequent increase in dopant gas flow to a higher second rate, the two depositing steps being conducted at a temperature range from about 500° C. to about 555° C. to render both the silicon layers to be amorphous as-deposited; and the converting step comprising rapid thermal processing of both substantially amorphous layers.

* * * * *

UNITED STATES PATENT AND TRADEMARK OFFICE
CERTIFICATE OF CORRECTION

PATENT NO. : 5,869,389

DATED : February 9, 1999

INVENTOR(S) : Er-Xuan Ping; Randhir P.S. Thakur

It is certified that error appears in the above-identified patent and that said Letters Patent is hereby corrected as shown below:

On the title page, Item [75], delete "Er-Xang Ping", and inserting therefor --Er-Xuan Ping--.

Col. 1, l. 6: Replace "*in sit*" with --*in situ*--.

Col. 2, l. 34: After "reference to", insert the word --the--.

Signed and Sealed this

Twenty-ninth Day of June, 1999

Attest:

Q. TODD DICKINSON

*Attesting Officer*     *Acting Commissioner of Patents and Trademarks*